March 12, 1974 I. E. MAGDO ET AL 3,796,613
METHOD OF FORMING DIELECTRIC ISOLATION FOR HIGH
DENSITY PEDESTAL SEMICONDUCTOR DEVICES
Filed June 18, 1971 3 Sheets-Sheet 1

INVENTORS
INGRID E. MAGDO
STEVEN MAGDO
BY George O. Saile
ATTORNEY

March 12, 1974 I. E. MAGDO ET AL 3,796,613

METHOD OF FORMING DIELECTRIC ISOLATION FOR HIGH DENSITY PEDESTAL SEMICONDUCTOR DEVICES

Filed June 18, 1971 3 Sheets-Sheet 2

United States Patent Office 3,796,613
Patented Mar. 12, 1974

3,796,613

METHOD OF FORMING DIELECTRIC ISOLATION FOR HIGH DENSITY PEDESTAL SEMICONDUCTOR DEVICES

Ingrid E. Magdo and Steven Magdo, Hopewell Junction, N.Y., assignors to International Business Machines Corporation, Armonk, N.Y.

Filed June 18, 1971, Ser. No. 154,455
Int. Cl. H01l 7/36, 11/00, 19/00
U.S. Cl. 148—175 10 Claims

ABSTRACT OF THE DISCLOSURE

A dielectrically isolated semiconductor device can be manufactured. The structure is useable for integrated circuits, including field effect and/or bipolar transistors, wherein a significant savings in surface area and reduction in capacitances can be obtained over prior techniques. The method involves forming a layer of dielectric material upon a semi-conductor body, having a diffused region where a bipolar device is to be formed, and then forming an opening in the layer to expose a part of the surface of the diffused region of the semiconductor body. An epitaxial layer of silicon is deposited on top. Single crystal silicon will grow over the exposed silicon area and if a diffused region is present in the substrate a pedestal will outdiffuse through the same area from the buried diffused region. Polycrystalline silicon will grow on top of the dielectric material. The pedestal is formed in a single crystal epitaxial layer of another impurity type. Two other active elements of a bipolar transistor, such as the emitter and intrinsic base regions, are then formed in the same single crystal epitaxial layer while the inactive area, such as the extrinsic base, is formed in polycrystalline silicon. A reach through is made through the dielectric layer to the third element of the transistor, that is collector region.

BACKGROUND OF THE INVENTION

The invention relates to methods of forming dielectrically isolated pedestal semiconductor devices which are particularly adapted to form a part of an integrated circuit.

CROSS-REFERENCE TO RELATED APPLICATION

Ser. No. 154,456, filed June 18, 1971 by I. Magdo and S. Magdo entitled "Method of Forming Dielectric Isolation for High Density Semiconductor Devices."

DESCRIPTION OF THE PRIOR ART

The advanced form of integrated circuits is the so called monolithic form. Such a structure contains great numbers of active and passive devices in a block or monolith of semiconductor material. Electrical connections between these active and passive components are generally made on the surface of the semiconductor block of material. The usual way of electrically isolating components, where it is desired, within the monolithic block of silicon is by what is called junction isolation where, for example, active P type diffusions are used to electrically isolate conventional NPN bipolar devices from one another and from other components such as resistors and capacitors. For a more detailed description of this type of junction isolation, the following patents may be referred to: W. E. Mutter, U.S. Pat. 3,319,311 issued May 16, 1967 and U.S. Pat. 3,451,866 issued June 24, 1969, and B. Agusta et al., U.S. Pat. 3,508,209 issued Apr. 21, 1970.

Another form of electrical isolation between active and passive devices which has been suggested is called dielectric isolation. In this type of isolation, pockets of semiconductor material are formed within regions of dielectric material such as silicon dioxide. Active and/or passive devices are then formed in the pockets of semiconductor material. Examples of this type of process and structure can be seen in greater detail in the R. E. Jones, Jr. U.S. Pat. 3,357,871 issued Dec. 12, 1967 and the J. G. Kren et al. U.S. Pat. 3,419,956 issued Jan. 7, 1969. A variation on this technique for forming dielectric regions which isolate semiconductor regions is shown in the V. Y. Doo U.S. Pat. 3,386,865 issued June 4, 1968 wherein a thermally grown silicon dioxide layer is formed on a substrate of silicon semiconductor material, openings formed in the silicon dioxide layer, epitaxial growth of silicon made in these openings well above the upper level of the silicon dioxide layer. Epitaxial layers do not grow where silicon dioxide coating is present, thus empty channels are formed. Pyrolytic $SiO_2$ is deposited on the top to fill the empty channels. The pyrolytic $SiO_2$ is then partly removed by abrading or differential etching to expose the epitaxial layers and to remove the large steps from the surface of the pyrolytic $SiO_2$. Finally, semiconductor devices are formed within these silicon epitaxial regions.

The dielectrically isolated type of electrical isolation has not been significantly used up to the present time for a variety of reasons which include principally manufacturability difficulties. For example, the principal difficulty in Doo's patented process is the removal of the several micron steps from the surface of the pyrolytic $SiO_2$ above the epitaxial regions. The only way to do that is abrading which is expensive and difficult to control. Further, the junction isolation has been very adequate up until the present time for the density of components required on a monolithic chip. However, it is now desired to substantially increase the density of semiconductor devices within the silicon monolithic integrated circuit for the bipolar devices to compete with field effect transistor monolithic integrated circuits which do not require special electrical isolation between devices. This type of device is inherently electrically isolated from the next device within the semiconductor monolith.

SUMMARY OF THE INVENTION

An object of the present invention is to provide methods for manufacture of dielectrically isolated semiconductor devices, such as bipolar and field effect transistors, which allows increased density within the monolithic chip while not requiring significant manufacturability problems. In this structure the base is completely surorunded with dielectric material except the pedestal region.

Another object of the invention is to provide methods for manufacturing dielectrically isolated bipolar pedestal integrated circuit structures wherein the packing density of the devices is significantly high and the surface is planar while stray and junction capacitances are significantly less than junction isolated structure.

These and other objects of the invention are accomplished according to the broad aspects of the invention by providing a process which requires the deposition of a dielectric layer onto a substrate body of monocrystalline semiconductor material. In making a bipolar transistor, the substrate will preferably have a diffused region of opposite conductivity type. The dielectric layer then has portions thereof etched away so that areas of the body of semiconductor surface are exposed. An epitaxial layer is grown on top of the wafer. Single crystal silicon will grow over the exposed silicon area and, in making a bipolar transistor, a pedestal will outdiffuse through the same area from the buried diffused region. Polycrystalline silicon will grow on top of the dielectric material. The pedestal is formed in single crystal epitaxial layer. The first portion of this layer is doped to form a pedestal of like conductivity to a region in the substrate. The upper portion of the epitaxial layer is of opposite conductivity. Two other active elements of the transistor, such as the emitter and intrinsic base, are formed in the upper part of the same single crystal epitaxial layer while the inactive area such as the extrinsic base is formed in polycrystalline silicon. A reach through is made through the dielectric layer to the third element of the transistor in the substrate which may be the collector. This results in an island of semiconductor material containing a high performance pedestal bipolar device dielectrically isolated from other such islands of semiconductor material which may contain other semiconductor devices of similar or different types.

DESCRIPTION OF THE PREFERRED EMBODIMENTS

Figure 2:
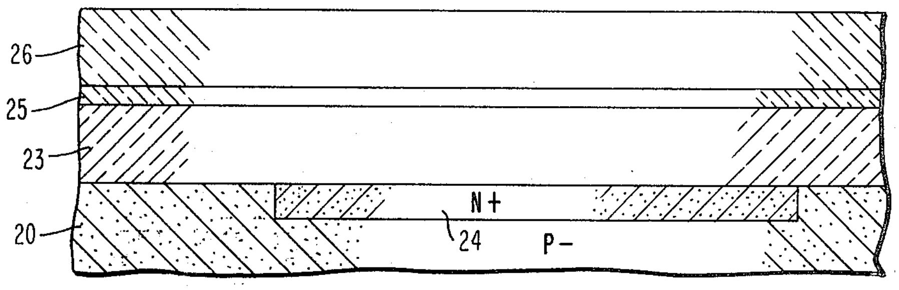
Figure 3:
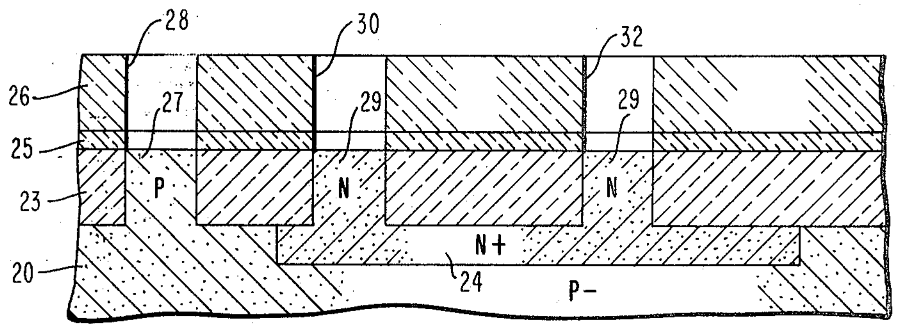
Figure 4:
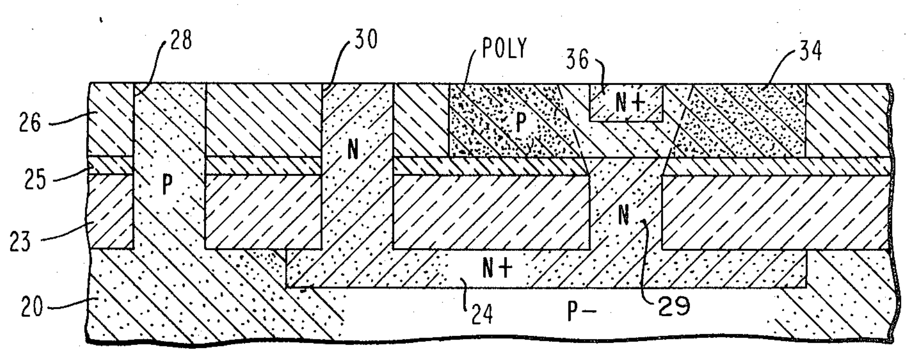

FIGS. 1 through 4 illustrate one method for manufacturing a resulting structure of a bipolar pedestal semiconductor device which may be a portion of an integrated circuit. It is, of course, not necessary that the device be a bipolar semiconductor device be formed in each of the isolated regions but other devices such as MOS field effect transistor, a resistor, capacitor or other active or passive devices could be formed therein. Alternately, active and/or passive devices could be formed by this method within one of these regions. For the purpose of description, a P− type silicon substrate is utilized and a NPN type pedestal semiconductor device is formed by the process. It is, of course, understood that the invention will also be applicable to the opposite type conductivities as well as to other semiconductor materials. Further, the three element transistor device could have its emitter buried and collector at its surface rather than, respectively, at its surface and buried as shown in FIG. 4.

Figure 1:
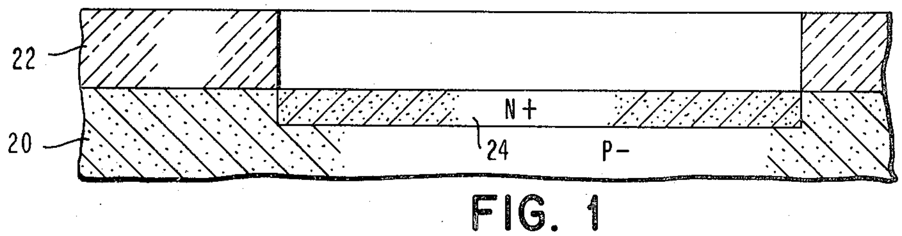
FIGS. 1 through 4 show sectional views of a fabrication method used to produce one embodiment of the present invention.

A suitable wafer 20 of P− material is obtained with a high quality polished surface. The wafer is thermally oxidized in the usual manner which may be by placing the silicon body in an oxidizing atmosphere at an elevated temperature with or without the addition of water vapor to the oxidation atmosphere. A layer could alternately be formed by other known techniques, such as pyrolytic deposition of silicon dioxide or other insulating materials. Openings in the silicon dioxide layer 22 are provided using conventional photoresist and etching technologies. A suitable etchant for silicon dioxide is an ammonium fluoride buffered solution of hydrofluoric acid. Following the etching step, all photoresist materials are removed by a suitable photoresist solvent. The N+ region 24 is formed by, for example, thermally diffusing an N+ impurity such as phosphorus, arsenic, antimony or the like through the opening in the silicon dioxide layer 22. The diffusion may be made by the usual open tube or closed tube thermal diffusion techniques, which is followed by a reoxidation cycle. The resulting structure is shown in FIG. 1.

The silicon dioxide layer 22 is then stripped from the surface of the wafer 20 by use of a buffered ammonium fluoride solution of hydrofluoric acid. The surface is preferably then reoxidized according to the usual thermal oxidation technique as described above for a time which will preferably produce a thermal oxide layer (not shown) of between about 700 to 2000 A. The preferred thickness is 1000 A. of thermal oxide. This thickness range is preferred in order to avoid surface damage during the subsequent sputtering step. At this time the wafer is placed in a RF sputtering apparatus such as the one described in the L. I. Maissel et al. U.S. Pat. 3,369,991 issued Feb. 20, 1968. A sputtered layer 23 of a dielectric material, such as silicon dioxide, having a thickness of about 0.5 to 2 microns is deposited onto the substrate 20. It is, however, preferred that a layer of about 1 micron of silicon dioxide is used.

The thin layer (not shown) of thermally grown silicon dioxide doped with a suitable impurity, such as boron, may be alternatively put down on substrate body 20 where the substrate is a P type substrate. This doping prevents surface inversion underneath the sputtered silicon dioxide isolation. The preferred doping amount is between about $10^{16}$–$10^{19}$ atoms/cc.

A thin layer of silicon nitride ($Si_3N_4$) 25 is deposited on top of the silicon dioxide 23 having a thickness of about 500–2000 A. It is preferred that this layer is about 1600 A. At this time the wafer is placed again in an RF sputtering apparatus as described earlier for the first layer 23. A sputtered layer 26 of dielectric material such as silicon dioxide having a thickness of about 1–2 microns is deposited onto the silicon nitride 25. It is, however, preferred that a layer of about 1.5 microns of silicon dioxide is used. The resulting structure is shown in FIG. 2.

The dielectric layer is removed in areas 28, 30, 32 as shown in FIG. 3. The removal of the dielectric layer is done by a chemical etching procedure using photolithographic techniques. Other etching techniques such as RF sputtering can be used to form these openings 28, 30, 32. An epitaxial layer of silicon 27 of P type conductivity is grown in the openings 28, 30, 32 to the height of the first silicon dioxide layer having a thickness of about one micron. Outdiffusion from the buried region 24 makes the regions 29 N type.

The second dielectric layer 26 is removed in those areas wherein an epitaxial silicon is to be grown to form the base region 34. The removal is the same as described for the removal of the first silicon dioxide layer 23. The silicon nitride layer 25 stops the overetching of the silicon dioxide layer 23.

A second epitaxial layer of P type conductivity is grown in the openings 28, 30, 34 such that the epitaxial layer is essentially planar with the top of the silicon dioxide dielectric 26. The final structure is shown in FIG. 4. In this structure the base is completely surrounded, even from underneath, with dielectric material except the pedestal region. The region grown in opening 28 is the reach through to form the substrate contact. The region grown in opening 30 is the reach through to form the contact to the transistor element such as the collector in the substrate. The region 29 is the lower epitaxial region forming the pedestal of the bipolar device. The upper epitaxial region 34 forms the base of the device and the third element 36 of the transistor, which may be the emitter, is formed within the region 34.

The epitaxial layers may be formed using the apparatus described in the E. O. Ernst et al. U.S. Pat. 3,424,629 issued Jan. 28, 1969. This is a very crucial step in the formation of the device of the present invention. The basic problem is the quality of the epitaxial growth in the openings between the dielectric layer and the problem of spikes at the epitaxial dielectric interface. Further, the height and width of the dielectric walls after epitaxial deposition must be controlled so that they are substantially equal to produce a substantially planar surface. The reason for this is, in the case of silicon dioxide and silicon the following reaction can take place during epitaxial deposition $$SiO_2 + Si \xrightarrow{\text{heat}} 2SiO$$

since silicon monoxide (SiO) is volatile at the deposition temperature no silicon will deposit on top of silicon dioxide. Polycrystalline silicon will, however, deposit on top of silicon nitride. The reduction of the temperature of the epitaxial deposition slows this reaction so that it is controlled. If the epitaxial deposition rate is faster than the above reaction, polycrystalline silicon will be deposited on the silicon dioxide dielectric layer. It has been found that the temperature and deposition rate may be adjusted during the epitaxial deposition to yield the above described structure reproducibly reliable. The preferred temperature range for epitaxial deposition is between about 950° C. and 1100° C. The preferred temperature is 1050° C. The operative deposition range is between about 0.1 and 0.5 micron. The preferred deposition range at the 1050° C. temperature is about 0.2 micron per minute.

The collector reach through diffusion of an N type impurity such as phosphorus or arsenic is made using the usual thermal oxidation, photoresist and etching techniques. The emitter diffusion to form region 36 is preferably an N+ diffusion of an impurity such as phosphorus or arsenic. It is made using the usual thermal oxidation, photoresist and etching techniques to open up diffusion windows for the emitter and collector contact.

A suitable photoresist layer is applied for openings to the rest of the elements of the transistors, that is the base and isolation. The blanket aluminum deposition or other suitable ohmic contact metal is then laid down on the surface and using standard photoresist techniques. The blanket metal is etched to leave the isolation, collector, base and emitter contacts (not shown).

The first epitaxial layers 27 and 29 are grown over the substrate 20. The nucleation of the epitaxially deposited silicon is on single crystal, therefore, the epitaxial silicon is single crystal. The second epitaxial layer is formed partially over single crystal structure and partially over silicon nitride 25. Over the silicon nitride the epitaxial silicon will form polycrystalline structure as shown in FIG. 4.

The active regions of the device such as emitter, intrinsic base region, and the pedestal subcollector are formed in the single crystal region of the device, therefore the device characteristics can be adjusted, depending upon the detailed process, as a device without dielectric isolation. Only the inactive part of the base where the base contacts are located, called extrinsic base has polycrystalline silicon. Since this part of the base does not participate in the transistor action, its polycrystalline structure does not affect the device performance.

Figure 5:
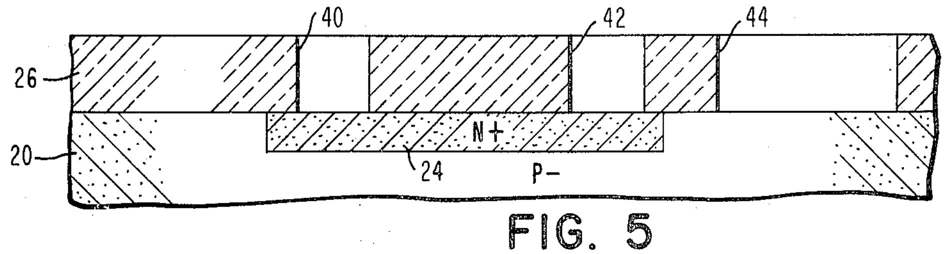
FIGS. 5 through 9 are cross-sectional views of a fabrication method and resulting structure to produce a second embodiment of the present invention.
Figure 6:
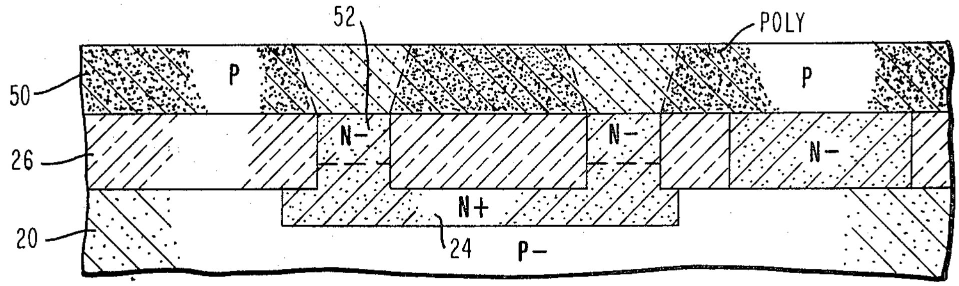
Figure 7:
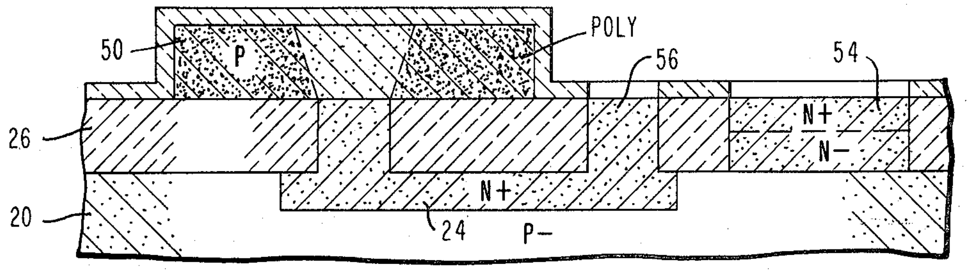
Figure 8:
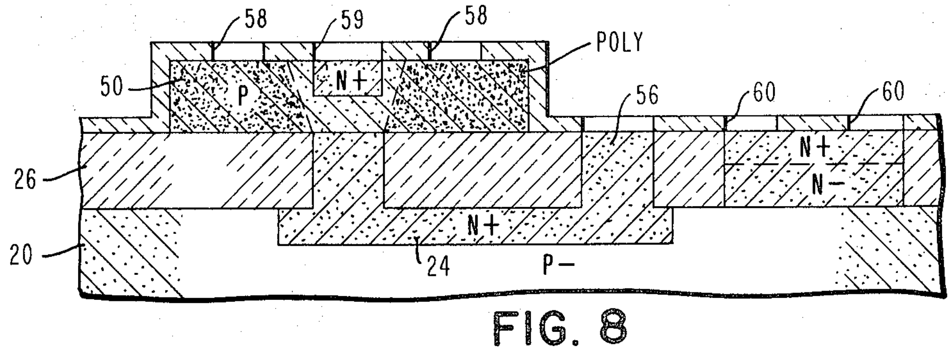

The second embodiment shown with the aid of FIGS. 5 through 8 begins its manufacture as was described above in FIG. 1. Following the deposition of the sputtered layer of silicon dioxide 26 covered with a layer of silicon nitride (not shown) of total thickness of about 0.3 to 1 micron, openings 40, 42 and 44 are formed in the sputtered layer 26. The openings 40 and 42 are positioned to extend to the buried region 24. The region 44 is positioned to one side of this buried region 24 and will ultimately be filled with a resistor structure. The resulting structure is shown in FIG. 5. The substrate is then positioned in a suitable epitaxial deposition chamber and the openings 40, 42 and 44 are filled with single crystal epitaxial growth while polycrystalline silicon will deposit on top of silicon nitride. During the epitaxial growth a portion of the N+ impurities from the region 24 move into the undoped or N− doped epitaxial growth regions as shown. The dopant in the epitaxial growth is changed to one of an opposite type, that is P such as boron, after the openings 40, 42 and 44 have been filled to form the required base profile. Epitaxial growth is then continued until a layer 50 of between 1 to 2 microns thickness is produced. The preferred thickness of the layer is 1 micron. The resulting structure is shown in FIG. 6. The surface of the epitaxial layer 50 is then oxidized and with the use of suitable photoresist and etching techniques the P layer 50 is removed in all areas except immediately above the pedestal region 52, as shown in FIG. 7, and the structure is reoxidized. A photoresist and etching series of steps are then used to open the collector reach through region 56 and resistor region 54. The collector contact region and resistor region are then thermally diffused with N impurity such as phosphorus or arsenic using conventional open tube or closed tube techniques. The structure is then reoxidized. A photoresist and etching series of steps are then used to open the resistor contact regions 60, collector contact 56 and emitter region 59. The collector contact region, resistor contact region and emitter region are then thermally diffused with a N+ impurity such as arsenic, phosphorus or antimony using conventional open tube or closed tube techniques. The base contact openings 58 as shown in FIG. 8 are then opened by conventional photoresist and etching techniques. A blanket metal deposition of a suitable ohmic contact metal is then laid down on the surface and using standard photoresist techniques the blanket metal is etched to leave the contacts to the base, emitter, collector reach through and resistor contacts (not shown). This embodiment as described in the first embodiment will also be comprised of polycrystalline and single crystal structure.

Figure 9:
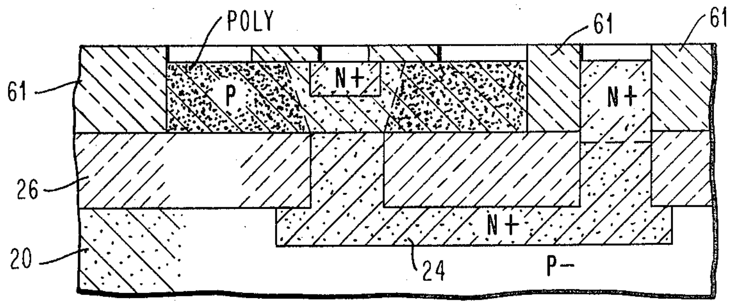

A variation of the second embodiment is shown in FIG. 9. In this case the P epitaxial layer is not removed as shown in FIG. 7. To provide isolation for the base certain polycrystalline regions 61, as shown in FIG. 9, are oxidized through thermally in such a way that the thermal oxidation reaches the buried dielectric material. Recessed oxidation is used for the above thermal oxidation cycle to provide planar surface. The recessed oxidation is described in patent application Ser. No. 150,609, filed June 7, 1971 by I. Magdo and S. Magdo entitled "Method of Forming Dielectric Isolation for High Density Semiconductor Devices."

Figure 10:
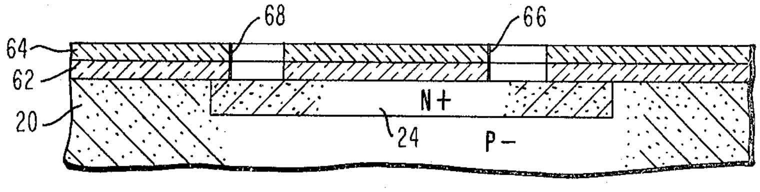
FIGS. 10 through 12 are cross-sectional views of a fabrication method and resulting structure to produce a third embodiment of the present invention.
Figure 11:
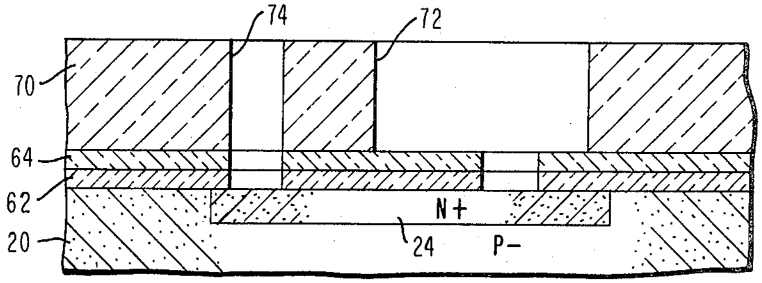
Figure 12:
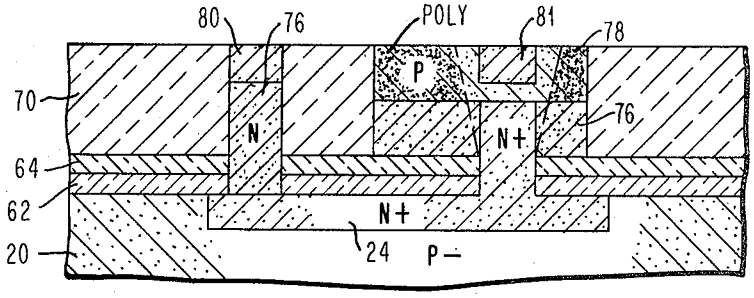

The third embodiment shown with the aid of FIGS. 10 through 12 begins its manufacture as was described above in FIG. 1. After the subcollector diffusion 24, a reoxidation cycle is followed such as to produce 500–2000 A. silicon dioxide 62 with or without the addition of water vapor. A thin layer 64 of silicon nitride is deposited having a thickness of 500–2000 A. The preferred thickness is 1000 A. Openings 66 and 68 are made in the silicon nitride layer 64 by standard photoresist and silicon nitride etching techniques. The resulting structure is shown in FIG. 10.

A layer 70 of dielectric material such as pyrolytic silicon dioxide, or sputtered silicon dioxide is laid down having a thickness of about 2 microns. The dielectric layer is removed in those areas 72 and 74 wherein a selective epitaxial layer of silicon is to be grown, as shown in FIG. 11. The removal is typically by a chemical etching procedure using photolithographic techniques or RF sputtering. The epitaxial layer, preferably undoped, is grown from the exposed silicon and silicon nitride areas until the epitaxial layer 76 is substantially planar with the dielectric material 70 using techniques described before.

The epitaxial layer is then reoxidized and the collector reach through window is opened with standard photoresist techniques and a N type of dopant such as phosphorus or arsenic is diffused to form region 80. The device is reoxidized and a suitable photoresist layer applied for opening of the base area 78 for diffusion which in this case is P dopant. The device is reoxidized, and emitter and collector contacts are opened with standard photoresist and etching techniques. An emitter diffusion of arsenic or phosphorus is made by conventional photoresist and diffusion techniques to produce emitter region 81. The resulting structure is shown in FIG. 12. The contacts to the base are opened and a suitable ohmic contact metal is laid down on the surface and using standard photoresist techniques, the metal is etched to leave the collector, base and emiter contacts (not shown).

This embodiment as described for the first embodiment will be comprised of polycrystalline and single crystal structures.

All three fabrication methods and resulting embodiments can be used for fabricating metal insulator semiconductor field effect transistors.

Figure 13:
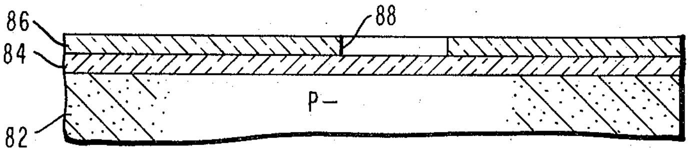
FIGS. 13 through 15 are cross-sectional views of a fabrication method and resulting structure to produce a fourth embodiment of the present invention.
Figure 14:
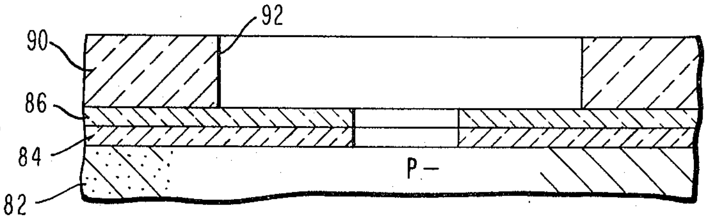
Figure 15:
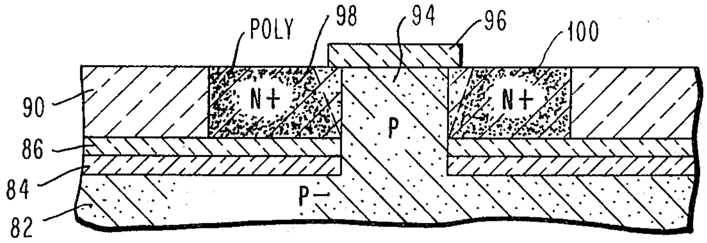

FIGS. 13 through 15 illustrate the manufacturing of a MOS field effect transistor using the third method described in FIGS. 10 through 12. This results in a fourth embodiment.

A suitable wafer 82 of P— material is obtained with a high quality polished surface. The wafer is thermally oxidized as described before to produce 500–2000 A. silicon dioxide 84. A thin layer of silicon nitride 86 having a thickness of 500–2000 A. is deposited on top of silicon dioxide. Opening 88 is made in the silicon nitride layer 86 with a process described before. The resulting structure is shown in FIG. 13.

A layer of dielectric material such as pyrolytic or sputtered silicon dioxide layer 90 having a thickness of 1–2 microns is deposited on top of the structure. The dielectric layer 90 is removed using techniques described before in that area 92 where the metal oxide semiconductor (MOS) transistor is to be formed as shown in FIG. 14.

A selective P epitaxial layer is grown, using techniques described before, from the exposed silicon and silicon nitride areas 92 until the epitaxial layer 94 is substantially planar with the dielectric material 90. Single crystal silicon will grow over the silicon while polycrystalline silicon will grow over the silicon nitride. The epitaxial layer is then thermally reoxidized 96 and suitable photoresist and etching steps are then used to open the source 98 and drain 100 areas. The source and drain regions are then thermally diffused with N+ impurity such as phosphorus or arsenic. The resulting structure is shown in FIG. 15. The following steps are standard MOS processing.

The active regions of the device such as the channel and partly the source and drain regions in contact with the channel are formed in the single crystal region. Only the inactive part of the source and drain have polycrystalline silicon. The source and drain regions are completely surrounded, even from underneath, with dielectric material except the sidewall in contact with the channel.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method for fabricating a dielectrically isolated pedestal transistor device comprising:

providing a substrate body of monocrystalline silicon of a first type conductivity;

forming a buried region of a second opposite conductivity in said substrate body;

forming a first layer of dielectric material upon said substrate body;

forming a second dielectric layer of $Si_3N_4$ on said first layer;

forming a third layer of dielectric material over said second dielectric layer;

forming at least one opening in said first, second and third layers of dielectric material over said buried region to expose the upper surface of said buried region;

said opening consisting of a first portion of said opening through said first layer of dielectric material and said second dielectric layer of $Si_3N_4$ of a predetermined area, and a second portion of said opening in said third dielectric layer having an area greater than the underlying first portion and which overlaps said first portion of said opening;

forming a monocrystalline silicon layer of a second conductivity type in said first portion of said opening;

continuing the growth of the silicon layer in said opening of a first opposite conductivity type wherein the layer is monocrystalline above the first portion of said opening in the dielectric material and polycrystalline elsewhere; and forming a region of a second conductivity type in said silicon layer.

2. The method of claim 1 wherein the said growth of the first conductivity is ceased when the growth is at least partially above the surface of said third layer of dielectric material.

3. The method for fabricating the dielectrically isolated pedestal transistor device of claim 4 wherein the transistor device includes a reach through contact to said buried region dielectrically isolated from the said opening containing the pedestal device.

4. The method of claim 1 wherein said semiconductor device is a bipolar transistor made by introducing from the surface an impurity into the monocrystalline silicon region of said silicon layer of a conductivity of a similar type as in said buried region, thus forming the emitter of the transistor.

5. The method of claim 4 wherein the impurity for forming said monocrystalline silicon layer of said second conductivity type is derived from out-diffusion from said buried region.

6. A method for fabricating a dielectrically isolated semiconductor device comprising:

providing a substrate body of monocrystalline silicon material;

forming a first dielectric layer on the surface of said body;

forming an overlying second dielectric layer of $Si_3N_4$ on said first layer;

forming at least one opening through the first and second dielectric layers exposing the surface of said substrate body;

forming a third dielectric layer on said second dielectric layer;

forming at least one opening through said third dielectric layer, said opening overlying said opening in said first and second dielectric layers, and having an area larger than said opening through said first and second layers;

selectively growing a layer of silicon within the opening in said first and second dielectric layer, and said opening in said third dielectric layer, said growing conditions adjusted to form a monocrystalline silicon region over the exposed substrate body and polycrystalline silicon over the exposed $Si_3N_4$ dielectric layer; and forming a device structure in said silicon region.

7. The method of claim 6 wherein an impurity is introduced into said substrate to form a buried region of a conductivity opposite to the conductivity of said substrate.

8. The method of claim 7 wherein an opening is formed through said first, second and third dielectric layers over said buried region and spaced from said first mentioned openings, forming an epitaxial layer of silicon in said second opening, which layer serves as an electrical terminal to said buried region.

9. The method of claim 7 wherein said layer of silicon formed within the said opening in said first and second dielectric layers is doped with an impurity out-diffusing from said buried region, and the upper overlying portion of said layer of silicon is of a second opposite conductivity type formed from a dopant incorporated into the reactant silicon stream.

10. A method for fabricating a semiconductor device comprising:

providing a substrate body of monocrystalline silicon material;

forming a first dielectric layer on the surface of said body, a second overlying dielectric layer of $Si_3N_4$ on said first layer, and a third dielectric layer on said second dielectric layer;

forming at least one opening through said first, second and third dielectric layers exposing the surface of said substrate body, said opening having a first portion through said first and second dielectric layer of a predetermined area, and a second portion extending through said third dielectric layer having an area larger than said first portion leaving exposed a surface portion of said second dielectric layer;

growing a layer of silicon within said at least one opening, thereby forming a monocrystalline silicon region over the exposed substrate body and polycrystalline silicon over the $Si_3N_4$ area of said second dielectric layer; and forming a device structure in said layer of silicon.

References Cited

UNITED STATES PATENTS

| | | | |
|---|---|---|---|
| 3,664,896 | 5/1972 | Duncan | 317—235 |
| 3,717,514 | 2/1973 | Burgess | 148—175 |
| 3,600,651 | 8/1971 | Duncan | 317—235 |
| 3,574,008 | 4/1971 | Rice | 148—175 |
| 3,189,973 | 6/1965 | Edwards et al. | 148—175 X |
| 3,617,826 | 11/1971 | Kobayashi | 317—235 |
| 3,506,893 | 4/1970 | Dhaka | 317—235 |
| 3,386,865 | 6/1968 | Doo | 148—175 |
| 3,206,339 | 9/1965 | Thornton | 148—175 |
| 3,511,702 | 5/1970 | Jackson et al. | 117—212 |
| 3,534,234 | 10/1970 | Clevenger | 317—235 |
| 3,586,925 | 6/1971 | Collard | 317—234 |
| 3,648,125 | 3/1972 | Peltzer | 317—235 |

OTHER REFERENCES

Magdo et al.: "Dielectrically Isolated Transistor," IBM Tech. Discl. Bull., vol. 13, No. 11, April 1971, p. 3238.

L. DEWAYNE RUTLEDGE, Primary Examiner

W. G. SABA, Assistant Examiner

U.S. Cl. X.R.

29—576, 578; 117—212, 215; 148—187, 191; 317—235 R